(12) United States Patent
He et al.

(10) Patent No.: US 7,687,556 B2
(45) Date of Patent: Mar. 30, 2010

(54) FLAME RETARDANT COMPOSITIONS

(75) Inventors: Guoren He, Franklin, NH (US);
William D. Varnell, Concord, NH (US);
Thomas J. Williams, Concord, NH (US)

(73) Assignee: Isola USA Corp., Chandler, AZ (US)

( * ) Notice: Subject to any disclaimer, the term of this patent is extended or adjusted under 35 U.S.C. 154(b) by 1170 days.

(21) Appl. No.: 10/952,033

(22) Filed: Sep. 28, 2004

(65) Prior Publication Data

US 2006/0069185 A1    Mar. 30, 2006

(51) Int. Cl.
*C07F 9/09* (2006.01)
*C08K 5/52* (2006.01)
*C08G 18/42* (2006.01)

(52) U.S. Cl. ........................ 524/127; 524/500
(58) Field of Classification Search .................. 524/127, 524/500
See application file for complete search history.

(56) References Cited

U.S. PATENT DOCUMENTS

| | | | | |
|---|---|---|---|---|
| 5,262,491 A | * | 11/1993 | Jain et al. | 525/396 |
| 6,576,700 B2 | * | 6/2003 | Patel | 524/508 |
| 6,875,387 B2 | * | 4/2005 | Mhetar et al. | 264/211 |
| 2003/0018131 A1 | * | 1/2003 | Davis et al. | 525/107 |
| 2004/0025743 A1 | | 2/2004 | Wakizaka et al. | |

FOREIGN PATENT DOCUMENTS

| | | |
|---|---|---|
| DE | 19525951 A1 | 1/1997 |
| JP | 2005105099 A | 4/2005 |
| JP | 2004091748 A | 5/2005 |

OTHER PUBLICATIONS

English translation of Official Action in a corresponding German Patent Application received on Apr. 16, 2007.
International Search Report and Written Opinion for PCT/US06/48843.

* cited by examiner

*Primary Examiner*—Nathan M Nutter
(74) *Attorney, Agent, or Firm*—Lando & Anastasi, LLP (57) ABSTRACT

Flame retardant compositions that are halogen-free or substantially halogen-free are disclosed. In certain examples, the compositions comprise a polyphenylene ether, a halogen-free or substantially halogen-free polyepoxide, and one or more phosphorated compounds. Prepregs, laminates, molded articles and printed circuit boards using the compositions are also disclosed.

25 Claims, 4 Drawing Sheets

FLAME RETARDANT COMPOSITIONS

FIELD OF THE TECHNOLOGY

Certain examples disclosed herein relate generally to flame retardant compositions. More particularly, certain examples relate to flame retardant compositions that are halogen-free or substantially halogen-free.

BACKGROUND

Curable polyphenylene ether compounds have been used in printed circuit boards (PCBs). Glass fiber cloth laminates made from these compositions have excellent properties including low dielectric constants and dissipation factors. Products using these compositions also have higher toughness than typical epoxy glass laminates which have been used in PCBs.

Many of the compositions currently in use in printed circuit boards use brominated chemicals as flame retardants. Bromine, and other halogens, can generate dioxin during burning. Dioxin is very harmful to mammals, having an $LD_{50}$ about 0.022 mg/kg when administered orally to rats.

SUMMARY

Certain aspects and examples disclosed herein are directed to halogen-free or substantially halogen-free flame retardant compositions useful in prepregs, laminates, printed circuit boards, molded articles, etc. More particularly, certain aspects and examples provide compositions that are prepared using substantially halogen-free epoxides or halogen-free epoxides. Certain examples of the compositions can be used as a composition. In certain examples, the compositions may be used to impregnate suitable materials to provide workable prepregs. Certain examples of the compositions provided here are readily soluble or suspendable in suitable solvents to facilitate impregnation. Examples of the compositions disclosed here are flame retardant, at least to some extent, have excellent dielectric properties and dimensional stability at high temperatures. Such properties allow for rapid assembly of, for example, prepregs, laminates, molded articles, and bonding sheets for printed circuit boards.

In accordance with a first aspect, a composition comprising at least one polyphenylene ether, at least one halogen-free epoxide or at least one substantially halogen-free epoxide, and at least one phosphorated compound is disclosed. In certain examples, the composition comprises about 20% to about 55% by weight of at least one polyphenylene ether, about 10% to about 40% by weight of at least one halogen-free polyepoxide or at least one substantially halogen-free polyepoxide, and about 10% to about 30% by weight of at least one phosphorated compound. In certain other examples, the composition comprises about 40-45%, e.g., about 43%, by weight of at least one polyphenylene ether, about 30-35%, e.g., about 32%, by weight of at least one halogen-free polyepoxide or at least one substantially halogen-free polyepoxide, and about 20-30%, e.g., about 25%, by weight of at least one phosphorated compound. In some examples, the composition further comprises a compatibilizing agent and at least one catalyst.

In accordance with an additional aspect, a composition comprising a first, second and third component is provided. The first component of the composition includes at least two structural units as shown in formula I.

In certain examples, $R_1$ and $R_2$ of formula I are each independently selected from the group consisting of hydrogen, primary or secondary lower alkyl, primary or secondary lower alkenyl, primary or secondary lower alkynyl, phenyl, amino, aminoalkyl, diaminoalkyl, acyl, and hydrocarbonoxy. The second component of the composition comprises an epoxide compound having one or more structural units as shown in formula II.

In formula II, $Q_1$, $Q_2$, $Q_3$ and $Q_4$ each may be independently selected from the group consisting of hydrogen, methyl, ethyl, propyl, ethylene, propylene, etc., m is 0 to 4, and n has an average value from about 0 to about 4. In certain examples, each of $A_1$ and $A_2$ can be a monocyclic divalent aromatic radical and Y can be a bridging radical in which one or two atoms separate $A_1$ from $A_2$. Other suitable moieties for the second component are discussed in more detail below. The third component may be a compound having suitable substitutents to provide a flame retardant amount of chemically combined phosphorous. In certain examples, the third component is an inorganic phosphate or an organic phosphate. Other suitable compounds that can provide flame retardant amounts of phosphorous are discussed in more detail below. In certain other examples, a compatibilizing agent may also be included in the composition. In yet other examples, one or more catalysts may also be included in the composition.

In accordance with another aspect, a halogen-free or substantially halogen-free composition comprising a flame retardant amount of chemically combined phosphorous and having a glass transition temperature of at least about 140° C. is disclosed. In certain examples, the composition comprises one or more of a polyphenylene ether, a halogen-free or substantially halogen-free polyepoxide, and a phosphorated compound. In certain examples, a compatibilizing agent and/or a catalyst are optionally included in the composition.

In accordance with yet an additional aspect, a halogen-free or substantially halogen-free composition comprising a flame retardant amount of chemically combined phosphorous and providing a peel strength of at least about 4 pounds per inch width as tested by IPC-TM-650 2.4.8C (dated December 1994 and entitled "Peel Strength of Metallic Clad Laminates") and 2.4.8.2 is provided. In certain examples, the composition comprises one or more of a polyphenylene ether, a halogen-free or substantially halogen-free polyepoxide, and a phosphorated compound. In certain examples, a compatibilizing agent and/or a catalyst are optionally included in the composition.

In accordance with another aspect, a halogen-free or substantially halogen-free composition comprising a flame retardant amount of chemically combined phosphorous and having a dielectric constant at 1 MHz (50% resin content by weight) of about 5.0 or less as tested by the two fluid cell method (IPC-TM-650 2.5.5.3C dated December 1987 and entitled "Permittivity (Dielectric Constant) and Loss Tangent (Dissipation Factor) of Materials (Two Fluid Cell Method)") is disclosed. In certain examples, the composition comprises one or more of a polyphenylene ether, a halogen-free or substantially halogen-free polyepoxide, and a phosphorated compound. In certain examples, a compatibilizing agent and/or a catalyst are optionally included in the composition.

In accordance with yet another aspect, a halogen-free or substantially halogen-free composition comprising a flame retardant amount of chemically combined phosphorous and having a dielectric dissipation factor at 1 MHz (50% resin content) of about 0.02 or less as tested by the two fluid cell method (IPC-TM-650 2.5.5.3C dated 12/87 and entitled "Permittivity (Dielectric Constant) and Loss Tangent (Dissipation Factor) of Materials (Two Fluid Cell Method)") is provided. In certain examples, the composition comprises one or more of a polyphenylene ether, a halogen-free or substantially halogen-free polyepoxide, and a phosphorated compound. In certain examples, a compatibilizing agent and/or a catalyst are optionally included in the composition.

In accordance with another aspect, a halogen-free or substantially halogen-free composition comprising a flame retardant amount of chemically combined phosphorous and having a flame retardancy of V-0 as defined by the UL-94 burn test is provided. The UL-94 burn test (dated Jul. 29, 1997), is hereby incorporated herein by reference, in its entirety, for all purposes. In certain examples, the halogen-free or substantially halogen-free composition comprises one or more of a polyphenylene ether, a polyepoxide, a compatibilizing agent and/or a catalyst.

In accordance with an additional aspect, a prepreg comprising a substrate with one or more of the compositions disclosed herein disposed on the substrate is provided. In certain examples, the composition disposed on the substrate comprises at least one polyphenylene ether, at least one halogen-free polyepoxide or at least one substantially halogen-free polyepoxide, and at least one phosphorated compound.

In accordance with another aspect, a laminate comprising at least two layers wherein, prior to curing, one layer is a prepreg is disclosed. In certain examples the prepreg comprises a first material impregnated with a composition comprising at least one polyphenylene ether, at least one halogen-free polyepoxide or at least one substantially halogen-free polyepoxide, and at least one phosphorated compound and optionally a compatibilizing agent is provided. In some examples, the laminate comprises two or more prepregs wherein each prepreg of the laminate is impregnated with the same composition, whereas in other examples, the prepregs of the laminate are impregnated with different compositions. In certain examples, the laminate is formed by laminate molding.

In accordance with yet an additional aspect, a molded article comprising a plurality of layers impregnated with a composition comprising at least one polyphenylene ether, at least one halogen-free polyepoxide or at least one substantially halogen-free polyepoxide, and at least one phosphorated compound and optionally a compatibilizing agent and/or a catalyst are disclosed. In certain examples, the layers of the molded article are each impregnated with the same composition, whereas in other examples, the layers of the molded article are impregnated with different compositions.

In accordance with another aspect, a printed circuit board comprising a dielectric substrate impregnated with one or more of the composition disclosed herein and having an electrically conductive layer on at least one surface of the dielectric substrate is provided. In certain examples, a printed circuit board comprises a dielectric substrate having an electrically conductive layer, e.g., a wiring layer, on one or both surfaces. In certain examples, the electrically conductive layer may be formed to have a predetermined pattern. In examples employing multiple electrically conductive layers, the layers may be connected electrically with each other. In some examples, the dielectric substrate comprises a glass cloth or a glass nonwoven fabric impregnated with a composition comprising at least one polyphenylene ether, at least one halogen-free polyepoxide or at least one substantially halogen-free polyepoxide, and at least one phosphorated compound. Optionally, a compatibilizing agent and/or a catalyst may also be included in the composition.

In accordance with a method aspect, a method of facilitating prepreg assembly is provided. The method comprises providing one or more halogen-free or substantially halogen-free compositions, such as those described herein. In certain examples, the halogen-free or substantially halogen-free composition comprises one or more of a polyphenylene ether, a polyepoxide and a phosphorated compound.

The flame retardant compositions disclosed herein, and devices using the flame retardant compositions, herein provide a significant advance. Flame retardant compositions, and devices using the flame retardant compositions, can be produced to provide environmentally friendly products as well as products with reduced toxicity. These and other aspects, examples and advantages are described in more detail below.

BRIEF DESCRIPTION OF THE FIGURES

Certain specific examples are described below with reference to the accompanying figures in which.

The features of the figures are not necessarily to scale and certain features in the figures may be enlarged or distorted relative to other features to provide a more user-friendly description of the inventive aspects and examples described herein.

DETAILED DESCRIPTION

It will be recognized by the person of ordinary skill in the art, given the benefit of this disclosure, that the compositions, and devices using the compositions, provide significant advantages not achieved with prior compositions. The compositions can be used in assembly of various single and multi-layered structures including, but not limited to, laminates, printed circuit boards, molded articles, aircraft plastics, silicon chip carriers, structural composites, resin coated foils, unreinforced substrates for high density circuit interconnect applications and other suitable applications where it may be desirable to use single or multi-layered structures having flame retardant and/or dielectric properties. In the examples described below, all percentages are weight percentages based on the total composition unless otherwise clear from the context.

In accordance with certain examples, the compositions disclosed herein are substantially halogen-free or halogen-free. As used herein the term "substantially halogen-free" refers to compositions that do not include any covalently bonded halogen groups in the final composition, but may include minimal amounts of residual halogens that are present in any remaining halogenated solvent or residual amounts of halogen that leaches from any containers or glassware used to synthesize and/or store the compositions. In certain examples, substantially halogen-free refers to less than about 0.12% by weight total halogen content in the final composition, more particularly less than about 0.09% by weight total halogen content in the final composition. Though residual amounts of halogen may be present in the final compositions, the residual amount does not impart, or retract from, the physical properties, e.g., flame retardancy, peel strength, dielectric properties, etc., of the final composition. In addition, any residual amounts of halogen that are present do not generate appreciable amounts of dioxin, or other toxic substances, during burning to be considered a health hazard to mammals, such as humans.

In accordance with certain examples, a halogen-free, or substantially halogen-free, composition that includes a flame retardant amount of chemically combined phosphorous is provided. As used here a "flame retardant amount of chemically combined phosphorous" refers to a sufficient amount of phosphorous to provide a composition that has a flame retardancy of V-0 as defined by the UL-94 burn test. In certain examples, the composition includes about 3-10% by weight chemically combined phosphorous. In other examples, the composition includes about 4-8% by weight chemically combined phosphorous. In certain other examples, the composition includes about 5-7% by weight chemically combined phosphorous. In yet other examples, the flame retardant amount of chemically combined phosphorous is about 6-7% by weight chemically combined phosphorous, e.g. about 6.6% by weight. The exact chemical form of the phosphorous can vary based on the composition. For example, in certain examples, the phosphorous is present as a phosphate compound, e.g., a monophosphate, diphosphate, triphospate, bis-phosphate, tris-phosphate, etc. In certain other examples, the phosphorous is present as a phosphonate compound. Additional suitable compounds that include one or more phosphorous atoms will be readily selected by the person of ordinary skill in the art, given the benefit of this disclosure. In certain examples, the phosphorous originates from phosphorated chemicals, e.g., inorganic and organic phosphates. For example, in certain examples, the phosphorated compound has a formula as shown below in formulae (III)-(VI).

(III)

-continued (IV)

(V)

(VI)

In formulae (III)-(VI), $R_{10}$, $R_{11}$ and $R_{12}$ each may be independently selected from the group consisting of alkyl, aryl, and alicyclic and heterocyclic groups that include nitrogen, oxygen and/or phosphorous. In certain examples, $R_{10}$, $R_{11}$, $R_{12}$ each is independently selected from primary or secondary lower alkyl (e.g., C1-C7 alkyl), primary or secondary lower alkenyl, (e.g. C2-C7 alkenyl), primary or secondary lower alkynyl (e.g., C2-C7 alkynyl), aryl, and alicyclic and heterocylic groups that include nitrogen, oxygen and phosphorous.

Exemplary commercially available materials that can be used to provide the source of phosphorous include, but are not limited to, ammonia polyphosphates such as Exolit® APP-422 and Exolit® APP-423 (commercially available from Clariant (Germany)), Arafil-72 and Arafil-76 (commercially available from Huntsman (Salt Lake City, Utah)) and Antiblaze® MC (commercially available from Albemarle (Baton Rouge, La.)), melamine polyphosphates such as Melapurg-200 and Melapurg-MP (commercially available from Ciba (Switzerland) and Fyrol(V-MP (commercially available from Akzo Nobel (Chicago, Ill.)), and organic phosphonates such as OP-930 and OP-1230 (commercially available from Clariant (Germany)). Other suitable phosphorous containing compounds, such as ammonium phosphates, ammonium polyphosphates, melamine phosphates, melamine polyphosphates, red phosphorus other organic and nitroorganic phosphorous compounds will be readily selected by the person of ordinary skill in the art, given the benefit of this disclosure.

In accordance with certain examples, the compositions disclosed herein may include one or more polyphenylene ether compounds. The polyphenylene ether compound typically has two or more structural units as shown in formula (I).

(I)

In certain examples, each $R_1$ and $R_2$ is independently selected from hydrogen, primary or secondary lower alkyl (e.g., alkyl containing between about 1-7 carbon atoms), primary or secondary lower alkenyl (e.g., alkenes containing between about 2-7 carbon atoms), primary or secondary lower alkynyl (e.g., alkynes containing between about 2-7 carbon atoms), phenyl, aminoalkyl, diaminoalkyl, acyl, and hydrocarbonoxy. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-, 3-, or 4-methylpentyl and the corresponding heptyl groups. Examples of secondary lower alkyl groups are isopropyl, sec-butyl, and 3-pentyl. In certain examples, any alkyl radicals are straight chain rather than branched. Most often, each $R_1$ is alkyl or phenyl, especially C1-4 alkyl, and each $R_2$ is hydrogen. In certain other examples, each $R_1$ and $R_2$ is independently selected from acetyl, formyl and other groups containing at least one carbonyl moiety.

In accordance with certain examples, polyphenylene ethers for use in the compositions disclosed herein may include, but are not limited to, homopolymer and copolymer polyphenylene ethers such as those commercially available from General Electric (Schenectady, N.Y.) and Asahi Chemicals (Kawasaki, Japan). For example, suitable homopolymers include, but are not limited to, those containing 2,6-dimethyl-1,4-phenylene ether units. Suitable copolymers include, but are not limited to, random copolymers containing such units in combination with, for example, 2,3,6-trimethyl-1,4-phenylene ether units. Suitable random copolymers, as well as suitable homopolymers, will be readily selected by the person of ordinary skill in the art, given the benefit of this disclosure. Exemplary commercially available polyphenylene ethers include the Noryl® brand of polyphenylene ethers, e.g., Noryl® PPO® (available from General Electric (Schenectady, N.Y.)). Additional commercially available polyphenylene ethers will be readily selected by the person of ordinary skill in the art, given the benefit of this disclosure.

In accordance with certain examples, polyphenylene ethers containing moieties which modify properties such as molecular weight, melt viscosity, and/or impact strength can also be used in the compositions disclosed herein. In certain examples, such property modifying moieties are halogen-free or substantially halogen-free. Such polymers will be readily selected by the person of ordinary skill in the art, given the benefit of this disclosure, and exemplary polymers may be prepared by grafting onto a polyphenylene ether in a known manner such non-hydroxy-containing vinyl monomers as acrylonitrile and vinylaromatic compounds (e.g., styrene), or such non-hydroxy-containing polymers as polystyrenes and elastomers. The resulting product may contain both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, heterocycles, and formals. Other suitable coupling agents will be readily selected by the person of ordinary skill in the art, given the benefit of this disclosure.

In accordance with certain examples, polyphenylene ethers used in the compositions disclosed herein may have a number average molecular weight within the range of about 3,000-50,000, more particularly at least about 10,000-20,000, e.g., at least about 15,000. In certain examples, polyphenylene ethers have a weight average molecular weight within the range of about 20,000-100,000 as determined by gel permeation chromatography, more particularly about 30,000-80,000, e.g., about 50,000. In certain examples, the polyphenylene ethers have an intrinsic viscosity in the range of about 0.35-0.6 dl/gram, more particularly about 0.35-0.5 dl/gram, e.g., about 0.4 dl/gram, as measured in chloroform at 25° C.

In accordance with certain examples, polyphenylene ethers can be prepared by the known oxidative coupling of at least one corresponding monohydroxyaromatic compound. Particularly useful and readily available monohydroxyaromatic compounds are 2,6-xylenol (wherein each $R_1$ and one $R_2$ of formula I are methyl and the other $R_2$ of formula I is hydrogen), whereupon the polymer may be characterized as a poly (2,6-dimethyl-1,4-phenylene ether), and 2,3,6-trimethylphenol (wherein each $R_1$ and one $R_2$ of formula I are methyl and the other $R_2$ is hydrogen). In certain examples polyphenylene ethers comprising molecules having aminoalkyl-substituted end groups, as described in numerous patents and publications, can be used. In certain examples, such molecules frequently constitute a substantial proportion of the polyphenylene ether, typically as much as about 90% by weight. Polymers of this type may be obtained by incorporating an appropriate primary or secondary monoamine as one of the constituents of the oxidative coupling reaction mixture.

In accordance with certain examples, the polyphenylene ether component, optionally, can be "equilibrated" by pre-reaction with an initiator, such as, for example, benzoyl peroxide, 2,2'-azo-bis-isobutyrylnitrile, lauroyl peroxide, tert-butyl peroxy-2-ethylhexanoate and tert-amyl peroxy -2-ethylhexanoate, in the presence of a bisphenol, such as bisphenol A (or the like), thereby reducing the molecular size of the polyphenylene ether chains via a cleavage reaction. As used herein, the term "bisphenol" refers to a compound containing two hydroxyphenyl groups attached to an aliphatic or cycloaliphatic moiety, which may also contain aromatic substituents. Without wishing to be bound by any particular scientific theory, the use of equilibrated polyphenylene ether can result in a marked reduction in varnish mix viscosity and can produce better fabric saturation and higher flow prepreg in the treating operation.

In accordance with certain examples, the compositions disclosed herein may include one or more halogen-free or substantially halogen-free epoxides. In certain examples, any epoxide that is halogen-free or substantially halogen-free and having 2 or more epoxide functionalities can be used in the compositions disclosed herein. As used herein, the term "polyepoxide" refers to compounds having two or more epoxide functionalities. Exemplary commercially available epoxides that can be used in the compositions disclosed herein include bisphenol-A epoxides, such as the Epon® family, e.g., Epon-826, Epon-828 and Epon-1001 (commercially available from Resolution (Houston, Tex.)), DER-331 and DER-332 (commercially available from Dow (Midland, Mich.)), and GY-6010 and GY-6020 (commercially available from Huntsman (Austin, Tex.)). Other commercially available epoxides that can be used in the compositions disclosed herein include bisphenol-F epoxides, such as Epon-862 (commercially available from Resolution (Houston, Tex.)) and GY-281, GY-282 and GY-285 (commercially available from Huntsman (Austin, Tex.)). Additional commercially available epoxides that can be used in the compositions disclosed herein include Novolac epoxides, such as Epon-1050 and Epon-164 (commercially available from Resolution (Houston, Tex.)), DER-431 and DER-432 (commercially available from Dow (Midland, Mich.)), and EPN-1080, EPN-1138 and ECN-1273 (commercially available from Huntsman (Austin, Tex.)). Yet other commercially available epoxides that can be used in the compositions disclosed herein include cycloaliphatic epoxides, such as ERL-4221 (commercially available from Union Carbide (Houston, Tex.)) and CY 179MA (commercially available from Huntsman (Austin, Tex.)). Additional commercially available epoxides will be readily selected by the person of ordinary skill in the art, given the benefit of this disclosure.

In accordance with certain examples, the epoxide component of certain compositions disclosed herein comprises at least one bisphenol polyglycidyl ether. In certain examples, the polyepoxide component may include at least one bisphenol polyglicydyl having an average of at most one aliphatic hydroxy group per molecule. In some examples, the polyepoxide component comprises a mixture of bisphenol polyglycidyl ethers. In certain examples, the polyepoxide component is halogen-free or substantially halogen-free. Polyepoxide compounds can be prepared conventionally by the reaction of bisphenols with epichlorohydrin. Such polyepoxide compounds may be represented by formula II:

(II)

In formula II, $Q_1$, $Q_2$, $Q_3$ and $Q_4$ are each independently selected from the group consisting of hydrogen, lower alkyl, lower alkenyl, lower alkynyl, and aryl. Y is selected from substituted and unsubstituted aryl, m is 0 to 4, n has an average value no greater than about 4 and in certain examples n has an average value up to about 1. In certain examples, each of $A_1$ and $A_2$ can be a monocyclic divalent aromatic radical and Y can be a bridging radical in which one or two atoms separate $A_1$ from $A_2$. In certain examples, the O-$A_1$ and $A_2$-O bonds in formula II may be in the meta- or para-positions of $A_1$ and $A_2$ in relation to Y. In formula II, the $A_1$ and $A_2$ values may be unsubstituted phenylene or substituted derivatives thereof, illustrative substituents (one or more) being alkyl, nitro, alkoxy and the like. In certain examples, unsubstituted phenylene radicals are used. Each of $A_1$ and $A_2$ may, for example, be ortho-phenylene or meta-phenylene and the other para-phenylene, but in certain examples, both $A_1$ and $A_2$ are para-phenylene. In certain examples, the bridging radical, Y, is one in which one or two atoms separate $A_1$ and $A_2$. In some examples, Y is a hydrocarbon radical and particularly a saturated radical such as methylene, cyclohexylmethylene, ethylene, isopropylidene, neopentylidene, cyclohexylidene or cyclopentadecylidene, especially a gem-alkylene (alkylidene) radical and more particularly isopropylidene. In other examples, Y may be a radical that contains atoms other than carbon and hydrogen; for example, carbonyl, oxy, thio, sulfoxy, and sulfone. It will be within the ability of the person of ordinary skill in the art, given the benefit of this disclosure, to select suitable polyepoxides for use in the compositions disclosed here.

In accordance with certain examples, a polyepoxide having formula (VII) as shown below is used in the compositions disclosed herein.

In the formula shown above, $R_3$, $R_4$, $R_5$, and $R_6$ are each independently selected from the group consisting of hydrogen, lower alkyl, lower alkenyl and lower alkynyl, and in which n has an average value between 0 and 4, more particularly n is about 1. In certain examples, $R_3$, $R_4$, $R_5$ and $R_6$ are each hydrogen.

In accordance with certain examples, the compositions disclosed herein optionally may include one or more compatibilizing agents to the polyphenylene ether and the polyepoxide components. Without wishing to be bound by any particular scientific theory, compatibilizing agents may be used to improve the solubility or miscibility of compounds or chemicals that are not typically soluble with each other. In certain examples, the compatibilizing agent is an intermediate that typically is soluble with both reagents and helps keep the total solution homogeneous. The exact nature of the compatibilizing agent can vary depending on the selected polyphenylene ether and selected polyepoxide. In certain examples, the compatibilizing agent is a non-metal agent, e.g., surfactant, dispersing agent, etc. In some examples, a poly(styrene maleic anhydride), such as SMA EF-40, SMA EF-60, etc. (Sartomer Company, Inc., (Exton, Pa.)) may be used as a compatibilizing agent. In other examples, a polyol may be used as a compatibilizing agent.

In certain examples, the compatibilizing agent is a transition metal salt that is present in an amount effective to compatabilize the polyphenylene ether and polyepoxide components. For example, a salt of zinc or tin may be used to compatabilize the polyphenylene ether and polyepoxide components. Certain transition metal salts, such as tin salts, may exhibit phase compatibilization as evidenced by behavior characterized by a single glass transition temperature. Additionally, when used with appropriate curing agents and cure accelerators, e.g., catalysts, enhanced cure characteristics of the compositions can be realized. The effective amount of the compatibilizing agent ranges typically from about 0.05 to 6.0% by weight, more particularly about 0.1 to about 5.0% by weight, e.g., about 1 to about 5% by weight, of the polyphenylene ether and polyepoxide components. In some examples, about 5% by weight of a transition metal salt, e.g., zinc octoate, may be used as a compatibilizing agent. Exemplary zinc salts include, for example, zinc octoate, di-alkyl zinc dicarboxylates, zinc mercaptides, zinc acetate, zinc oxide, zinc citrate, zinc oxylate, zinc acetylacetonate, zinc stearate, zinc naphthenate and the like and even mixtures thereof. Exemplary tin metal salts include, for example, stannous octoate, di-alkyl tin dicarboxylates such as dibutyl tin (VII)

dicarboxylates (e.g. dibutyl tin dioctoate), tin mercaptides (e.g. dibutyl tin dilauryl mercaptide), stannous acetate, stannic oxide, stannous citrate, stannous oxylate, stannous chloride, stannic chloride, tetra-phenyl tin, tetra-butyl tin, tri-n-butyl tin acetate, di-n-butyl tin dilaurate, dimethyl tin dichloride, and the like and even mixtures thereof. In some examples, the compatibilizing agent may also act as a catalyst to promote reaction between the polyphenylene ether and polyepoxide components.

In accordance with certain examples, the compositions disclosed herein may also include an effective amount of catalyst. In certain examples, the catalyst is one or more imidazoles and/or arylene polyamines. In particular, an imadozole catalyst can be, for example, imidazole, 1-methylimidazole, 1,2-dimethylimidazole, 2-methylimidazole, 2-heptadecylimidazole, 2-ethyl-4-methylimidazole, 2-undecylimidazole, and 1-(2-cyanoethyl)-2-phenylimidazole. Exemplary arylene polyamine catalysts include, but are not limited to, diethyltoluenediamine, tris(dimethylaminomethyl)phenol, and 3-phenyl-1,1-dimethyl urea. In other examples, imidazole-arylene polyamine mixtures can be used; in particular, mixtures including arylene polyamines with a high degree of alkyl substitution on the aromatic ring, typically at least three such substituents, can be used. For example, diethylmethyl-substituted meta- and para-phenylenediamines can be used as polyamine catalysts.

In accordance with certain other examples, silane coupling agents can be used in the compositions disclosed herein. Exemplary silanes include, but are not limited to, 3-(2-aminoethyl)-aminopropyl trimethoxysilane, gamma-aminopropyl triethoxysilane, and glycidoxypropyl trimethoxysilane. Silanes can be used as co-catalysts or can be the primary catalyst.

In accordance with certain examples, the exact amount of catalyst can vary depending on the make-up of the compositions. In at least certain examples, a catalytically effective amount of catalyst is used to achieve curing after solvent removal. Most often, it is at least 4.5 and more particularly at least 10 milliequivalents of basic nitrogen per 100 parts of total curable composition, including any basic nitrogen present in the polyphenylene ether (mostly as aminoalkyl-substituted end groups). When a polyphenylene ether essentially free from basic nitrogen is employed, it may be necessary to increase the proportion of catalyst to provide reasonable reaction rates. (For the purpose of this disclosure, the equivalent weight of an imidazole is its molecular weight and that of a diamine is half its molecular weight.)

In accordance with certain examples, co-catalysts and activators can be used to achieve advantageous cure rates. Salts of diketones in which one carbon atom separates the carbonyl groups, especially acetylacetonates, and salts of fatty acids, especially stearates and octoates, are examples of suitable forms of zinc, magnesium, or aluminum for this purpose. Specific examples include zinc acetylacetonate, zinc stearate, magnesium stearate, aluminum acetylacetonate, zinc octoate, zinc neodecanoate, and zinc naphthenate. Additional secondary catalysts include, for example, maleic anhydride and $BF_3$-ethylamine complex. In certain examples, co-catalysts can be employed in a cocatalytically effective amount, and may also serve to improve solvent resistance and flame retardancy. For example, about 0.1%-1.5% of zinc, magnesium, or aluminum, based on total curable composition, can be present as a co-catalyst. Under certain conditions, acetylacetonates such as zinc acetylacetonate can form hydrates which readily lose acetylacetone and become insoluble in the organic systems used for laminate preparation. Therefore, it may be necessary to take steps to maintain the zinc or aluminum in stable dispersion. One method for doing this is to subject the composition to continuous agitation. An additional method is to form an alcoholate of the acetylacetonate, as by reaction with methanol. The alcoholate loses alcohol rather than acetylacetonate under similar conditions, remaining in solution or homogeneous suspension.

In accordance with certain other examples, the compositions disclosed herein may also include additional compounds to maximize homogeneity. For examples, fatty acid salts, detergents, surfactants, oils, metal compounds, e.g., titanium compounds, and the like may be added to increase homogeneity. Additional suitable compounds for increasing homogeneity will be readily selected by the person of ordinary skill in the art, given the benefit of this disclosure.

In accordance with certain examples, the compositions disclosed herein may also include one or more additional materials. For example, the compositions can include inert, particulate fillers such as talc, clay, mica, silica, alumina, Fuselex, Minusil 5, spodumene, and calcium carbonate. In examples comprising fillers, about 5 to about 40 parts by weight filler is typically mixed with about 100 parts of the flame retardant composition. Fabric wettability enhancers (e.g. wetting agents and coupling agents) and polar liquids such as n-butyl alcohol, methyl ethyl ketone, polysiloxanes, and tetrahydrofuran, may be advantageous under certain conditions. Such materials as antioxidants, thermal and ultraviolet stabilizers, lubricants, antistatic agents, dyes, and pigments may also be present.

In accordance with certain examples, the compositions disclosed herein are typically dissolved in an effective amount of an inert solvent, e.g., an inert organic solvent, typically to a solute content of about 30%-60% by weight, more particularly about 50%-60% by weight, e.g., about 55% by weight. The nature and identity of the solvent is not critical, provided that the solvent is amenable to removal through facile means, such as evaporation. In certain examples, aromatic hydrocarbons, such as benzene and toluene, are used. The order of blending and dissolution is also not critical; however, in order to avoid premature curing, catalyst and hardener components generally should not be brought initially into contact with the polyphenylene ether and polyepoxide components at a temperature above about 60° C.

A significant advantage of the compositions disclosed herein is that flame retardancy synergists, such as antimony pentoxide, are unnecessary. However, flame retardancy synergists may be incorporated when appropriate. When a flame retardancy synergist is employed, it should be maintained in stable dispersion. This may be done by agitation and/or combination with a suitable dispersing agent, of which many are known in the art. The proportion of flame retardancy synergist is usually up to about 4 parts per 100 parts of the polyphenylene ether and polyepoxide components.

In accordance with certain examples, a dispersing agent may also be used in the compositions disclosed herein. One exemplary dispersing agent is a polymer, e.g., a polyester, which is compatible with the components of the composition but is substantially non-reactive under the conditions employed. More powerful dispersing agents, such as amines, may be required if fatty acid salts are present, since such salts may otherwise form insoluble complexes with antimony pentoxide.

In accordance with certain examples, materials that improve the solvent resistance of the compositions may also be included. For example, a material whose presence in minor amounts may improve the solvent resistance and compatibility of the composition is at least one aliphatic tris(dialkylphosphato)titanate. Suitable phosphatotitanates are known in the art and commercially available. Exemplary phosphatotitanates may be represented by the formula (VIII) shown below.

(VIII)

wherein $R_{20}$ is C2-6 primary or secondary alkyl or alkenyl and more particularly alkenyl, $R_2$, is C1-3 alkylene and more particularly methylene, $R_{22}$ is C1-5 primary or secondary alkyl, $R_{23}$ is a straight chain or branched hydrocarbon having one to eight carbon atoms, and x is from 0 to about 3, more particularly 0 or 1. In some examples, $R_{20}$ is alkyl, $R_{21}$ is methylene, $R_{22}$ is ethyl, $R_{23}$ is octyl and x is 0. The phosphatotitanate is most often present in the amount of about 0.1-1.0 part by weight per 100 parts of the composition, more particularly about 0.2 to about 0.8 parts by weight per 100 parts of the composition, e.g., about 0.4 to about 0.6 parts by weight per 100 parts of the composition. It will be within the ability of the person of ordinary skill in the art, given the benefit of this disclosure, to select suitable materials and suitable amounts of the materials to improve the solvent resistance of the compositions disclosed herein.

In accordance with certain examples, a halogen-free or substantially halogen-free composition comprising a flame retardant amount of chemically combined phosphorous and having a glass transition temperature of at least about 140° C. is disclosed. In certain examples, the composition may include a polyphenylene ether, a halogen-free or substantially halogen-free polyepoxide, a flame retardant amount of chemically combined phosphorous and optionally a compatibilizing agent and/or catalyst. The exact parts by weight of the polyphenylene ether, halogen-free or substantially halogen-free polyepoxide, and flame retardant amount of chemically combined phosphorous can vary so long as the glass transition temperature of the composition is about 140° C. or greater. In certain examples, the composition includes about 40-45%, e.g., about 43%, by weight polyphenylene ether. In other examples, the composition comprises about 30-35%, e.g., about 32%, by weight halogen-free polyepoxide or about 30-35%, e.g., about 32%, by weight substantially halogen-free polyepoxide. In yet other examples, the composition comprises about 20-30%, e.g., about 25%, by weight of one or more phosphorated compounds. In some examples, the flame retardant amount of chemically combined phosphorous is about 3-10%, 4-8%, or 6-7% by weight phosphorous based on the weight of the composition. In yet other examples, the flame retardant amount of chemically combined phosphorous is about 6.6% by weight phosphorous based on the weight of the composition. The polyphenylene ether, polyepoxide and phosphorated compound may be any of those components discussed herein and other suitable components that will be readily selected by the person of ordinary skill in the art, given the benefit of this disclosure.

In accordance with certain examples, a halogen-free or substantially halogen-free composition comprising a flame retardant amount of chemically combined phosphorous and providing a peel strength of at least about 4 lb/inch width as tested by IPC-TM-650 2.4.8C is disclosed. The IPC-TM-650 2.4.8C test method is incorporated herein by reference in its entirety for all purposes. In certain examples, the composition comprises a polyphenylene ether, a halogen-free or substantially halogen-free polyepoxide, a flame retardant amount of chemically combined phosphorous and optionally a compatibilizing agent and/or a catalyst. The exact parts by weight of the polyphenylene ether, halogen-free or substantially halogen-free polyepoxide, and flame retardant amount of chemically combined phosphorous can vary so long as the composition provides a peel strength that is at least about 4 lb/inch width as tested by IPC-TM-650 2.4.8C. In certain examples, the composition includes about 40-45%, e.g., about 43%, by weight polyphenylene ether. In other examples, the composition comprises about 30-35%, e.g., about 32%, by weight halogen-free polyepoxide or 32% by weight substantially halogen-free polyepoxide. In yet other examples, the composition comprises about 20-30%, e.g. about 25%, by weight of one or more phosphorated compounds. In some examples, the flame retardant amount of chemically combined phosphorous is about 3-10%, 4-8% or 6-7% by weight phosphorous based on the weight of the composition. In yet other examples, the flame retardant amount of chemically combined phosphorous is about 6.6% by weight phosphorous based on the weight of the composition. The polyphenylene ether, polyepoxide and phosphorated compound may be any of those components discussed herein and other suitable components that will be readily selected by the person of ordinary skill in the art, given the benefit of this disclosure.

In accordance with certain examples, a halogen-free or substantially halogen-free composition comprising a flame retardant amount of chemically combined phosphorous and having a dielectric constant at 1 MHz (50% resin content) of about 5.0 or less as tested by the two fluid cell method is disclosed. The two fluid cell method is described in IPC-TM-650 2.5.5.3C dated December 1987 and entitled "Permittivity (Dielectric Constant) and Loss Tangent (Dissipation Factor) of Materials (Two Fluid Cell Method)," the entire disclosure of which is incorporated herein by reference for all purposes. In certain examples, the composition comprises a polyphenylene ether, a halogen-free or substantially halogen-free polyepoxide, a flame retardant amount of chemically combined phosphorous and optionally a catalyst. The exact parts by weight of the polyphenylene ether, halogen-free or substantially halogen-free polyepoxide, and flame retardant amount of chemically combined phosphorous can vary so long as the composition has a dielectric constant that is less than about 5.0, more particularly less than about 4.0 or less than about 3.0. In certain examples, the composition includes about 40-45%, e.g., about 43%, by weight polyphenylene ether. In other examples, the composition includes about 30-35%, e.g., about 32%, by weight halogen-free polyepoxide or about 30-35%, e.g., about 32%, by weight substantially halogen-free polyepoxide. In yet other examples, the composition includes about 20-30%, e.g., about 25%, by weight of one or more phosphorated compounds. In some examples, the flame retardant amount of chemically combined phosphorous is about 3-10%, 4-8% or 6-7% by weight phosphorous based on the weight of the composition. In yet other examples, the flame retardant amount of chemically combined phosphorous is about 6.6% by weight phosphorous based on the weight of the composition. The polyphenylene ether, polyepoxide and phosphorated compound may be any of those components discussed herein and other suitable components that will be readily selected by the person of ordinary skill in the art, given the benefit of this disclosure.

In accordance with certain examples, a halogen-free or substantially halogen-free composition comprising a flame retardant amount of chemically combined phosphorous and having a dielectric dissipation factor at 1 MHz (50% resin content) of about 0.02 or less as tested by the two fluid cell method is provided. In certain examples, the composition comprises a polyphenylene ether, a halogen-free or substantially halogen-free polyepoxide, a flame retardant amount of chemically combined phosphorous and optionally a compatibilizing agent and a catalyst. The exact parts by weight of the polyphenylene ether, halogen-free or substantially halogen-free polyepoxide, and flame retardant amount of chemically combined phosphorous can vary so long as the composition has a dielectric dissipation factor at 1 MHz of about 0.02 or less. In certain examples, the composition includes about 40-45%, e.g., about 43%, by weight polyphenylene ether. In other examples, the composition includes about 30-35%, e.g., about 32%, by weight halogen-free polyepoxide or 30-35%, e.g., about 32%, by weight substantially halogen-free polyepoxide. In yet other examples, the composition includes about 20-30%, e.g., about 25%, by weight of one or more phosphorated compounds. In some examples, the flame retardant amount of chemically combined phosphorous is about 3-10%, 4-8% or 6-7% by weight phosphorous based on the weight of the composition. In yet other examples, the flame retardant amount of chemically combined phosphorous is about 6.6% by weight phosphorous based on the weight of the composition. The polyphenylene ether, polyepoxide and phosphorated compound may be any of those components discussed herein and other suitable components that will be readily selected by the person of ordinary skill in the art, given the benefit of this disclosure.

In accordance with certain examples, a halogen-free or substantially halogen-free flame retardant composition comprising a flame retardant amount of phosphorous and having a flame retardancy of V-0 as defined by the UL-94 burn test is disclosed. In certain examples, the flame retardant composition further comprises a polyphenylene ether, e.g., about 40-45%, e.g., about 43%, by weight polyphenylene ether. In other examples, the flame retardant composition further comprises a polyepoxide, e.g. about 30-35%, e.g., about 32%, by weight halogen-free or substantially halogen-free polyepoxide. In some examples, the composition comprises about 20-30%, e.g., about 25%, by weight of one or more phosphorated compounds. In yet other examples, the flame retardant composition further comprises a compatibilizing agent, a curing agent or both. In still other examples, the flame retardant composition further comprises a polyphenylene ether, a polyepoxide, a phosphorated compound and optionally a compatibilizing agent and a curing agent. It will be within the ability of the person of ordinary skill in the art, given the benefit of this disclosure, to select suitable polyphenylene ethers, polyepoxides, compatibilizing agents and/or curing agents to provide include suitable flame retardant composition comprising a flame retardant amount of phosphate and having a flame retardancy of V-0 as defined by the UL-94 burn test.

Figure 1:
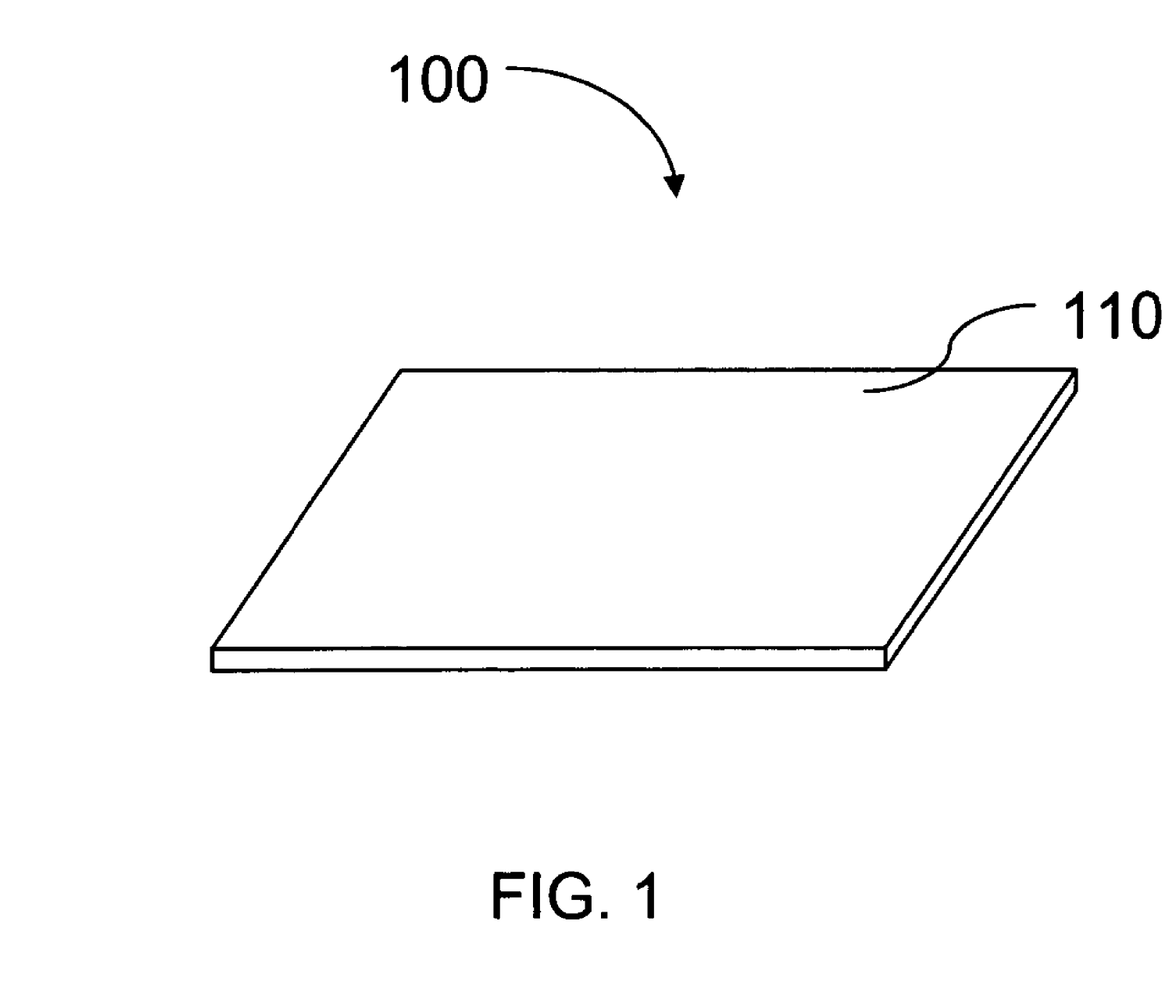
FIG. 1 is an example of a prepreg, in accordance with certain examples.

In accordance with certain examples, one or more of the compositions disclosed herein may be used in one or more prepregs. Without wishing to be bound by any particular scientific theory, a prepreg comprises a substrate (e.g., woven or non-woven fibrous substrate) such as glass, quartz, polyester, polyamide, polypropylene, cellulose, nylon or acrylic fibers, low dielectric unidirectional tape, or woven cloth or nonwoven fabric of interbonding fibers with a composition disposed on the substrate. Suitable low dielectric fibers include high strength fibers such as glass fibers, ceramic fibers and aramid fibers, which are commercially available. In certain examples, prepreg fibers may have a consistent fiber orientation. The prepreg is impregnated with a composition, such as any one or more of the compositions disclosed herein, and such prepregs may be cured by application of heat and pressure. Referring now to FIG. 1, prepreg 100 comprises a generally planar substrate 110 with one or more of the compositions disclosed herein disposed on or in substrate 110. The thickness of the substrate can vary, and in certain examples, the substrate is about 1 mil to about 15 mils thick, more particularly, about 1 mil to about 10 mils thick, e.g., about 2-9, 3-8, 4-7 or 5-6 mils thick. It will be within the ability of the person of ordinary skill in the art, given the benefit of this disclosure, to select suitable thicknesses for prepreg substrates.

In accordance with certain examples, a prepreg can be formed by disposing one or more of the compositions disclosed herein on or in a substrate. In certain examples, a substrate can be partially covered or masked so that only a portion of the substrate receives one or more of the compositions described herein. In other examples, substantially all of the substrate receives one or more of the compositions disclosed herein. An applicator, such as a brush, roller, spray nozzle, etc. can apply one or more of the compositions to the substrate. In some examples, one or more additional applications of the composition can be performed such that the substrate is substantially saturated with the composition. In certain examples, one or more areas of the substrate receive a substantially greater amount of the composition than another area. Such differential disposition of the compositions disclosed herein can provide prepregs having areas with different physical and/or electrical properties.

In accordance with certain examples, after disposal of one or more of the compositions on a substrate, the prepreg is typically stacked with other prepregs and the resulting assembly is cured to remove any solvent from the disposed composition. In certain examples, the prepreg stack is cured by placing the prepreg stack in an oven at a temperature above the vaporization temperature of the solvent. The oven temperature causes the solvent to evaporate and cures the prepreg stack. The cured prepreg stack may be used to form numerous devices, such as laminates, molded articles, printed circuit boards, etc. The person of ordinary skill in the art, given the benefit of this disclosure, will be able to use the compositions disclosed here to form prepregs.

In accordance with certain examples, the prepreg may include additional materials to alter the physical and/or electrical properties of the prepreg. For example, materials such as elastomers, thermoplastics, etc. may be added to the prepreg to alter the properties, e.g., to increase fracture resistance. The prepregs may also include fillers, whiskers, particles and the like to alter the properties of the prepreg. In some examples, the substrate of the prepreg includes, on one or both sides, cloth, a sheet of reinforcing fibers, glass, carbon fibers, aromatics, liquid crystals, fibrous mats, conductive oils, metal foils such as copper foils, etc. It will be within the ability of the person of ordinary skill in the art, given the benefit of this disclosure, to include additional materials in prepregs to impart desired physical and/or electrical properties to the prepreg.

Figure 2A:
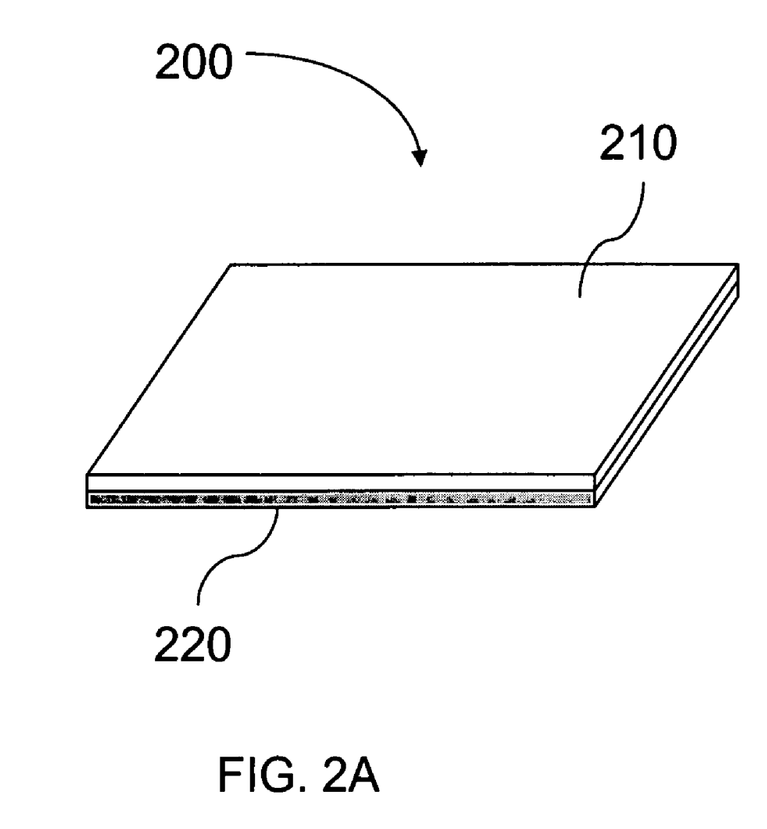
FIG. 2 is an example of a laminate, in accordance with certain examples.
Figure 2B:
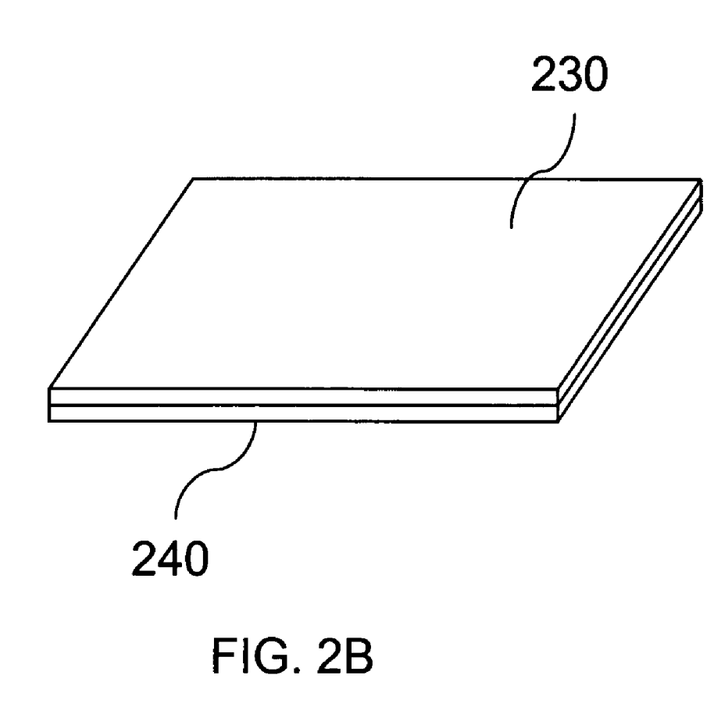

In accordance with certain examples, a laminate comprising at least two layers wherein at least one layer is a prepreg is disclosed. As used here, the term laminate refers to a device comprising at least two layers, wherein one of the layers is a prepreg, more particularly at least about 1 to about 10 layers of the laminate is a prepreg, e.g., about 1 to about 2 layers of the laminate are prepregs. The laminate may include one or more electrically conductive layers, e.g., non-metal or metal foil layers, disposed on one or more sides of the laminate. For example, referring to FIG. 2A, laminate 200 comprises prepreg 210 and metal foil 220. In other examples, a laminate may comprise two or more prepregs, such as prepreg 230 and prepreg 240 shown in FIG. 2B. Laminates are typically prepared by laminate-pressing, compression molding or laminate molding, as described in numerous publications and patents. For example, laminates can be produced by stacking on one another 1 to 20 pieces of prepreg, placing on one surface or both surfaces of the stacked prepreg a non-metal foil or metal foil, e.g. copper foil, aluminum foil, tin foil, etc., and subjecting the resultant structure to laminate molding. Suitable non-metal foils will be readily selected by the person of ordinary skill in the art, given the benefit of this disclosure, and exemplary non-metal foils include those containing plastics, ceramics, elastomers, carbon black, graphite, and diamond. With respect to the type of metal foil, any suitable metal foil that can be used in the application of electrically insulating materials and/or electrically conductive materials can be used. In addition, as conditions for molding, for example, those used in methods for laminated sheet and multilayer sheet for electrically insulating materials can be employed, and, for example, molding can be conducted using a multi-stage press, a multi-stage vacuum press, a continuous molding machine, or an autoclave molding machine by heating at a suitable temperature, e.g., 100 to 250° C. at a pressure of 2 to 100 kg/cm$^2$ for about 0.1 to 5 hours. Further, the prepreg can be combined with a wiring board for inner layer and subjected to laminate molding to produce a multilayer sheet. It will be within the ability of the person of ordinary skill in the art, given the benefit of this disclosure, to produce laminates using the compositions and prepregs described herein.

Figure 3:
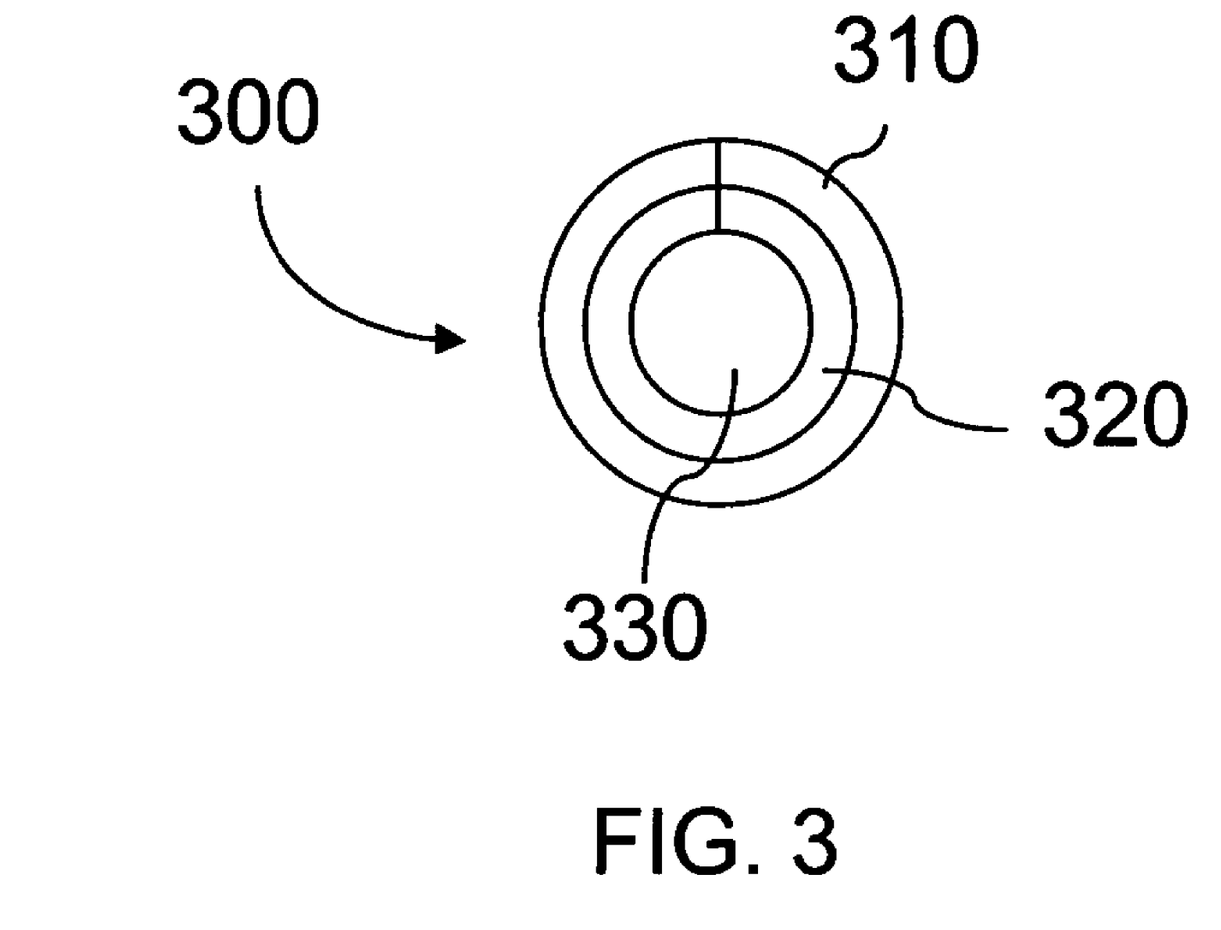
FIG. 3 is an example of a molded article, in accordance with certain examples.

In accordance with certain examples, a molded article comprising one or more of the prepregs disclosed herein is provided. In certain examples, the molded article is produced using one or more of the compositions described herein and suitable fibers to provide a fiber reinforced plastic. In other examples, the molded article is produced from one or more prepregs and formed into a desired shape, such as a tube, by winding layers of prepregs around a device, such as a mandrel, and heating and pressing the layers. In other examples, the molded article is formed in a desired shape to provide fishing rods, golf club shafts, aircraft panels, aircraft wings, etc. In certain examples, the prepregs are cut to shape prior to curing, whereas in other examples, the prepregs are cured and then cut to a desired shape. It will be within the ability of the person of ordinary skill in the art, given the benefit of this disclosure, to produce molded articles using the compositions and prepregs disclosed herein. Referring to FIG. 3, a tubular molded article 300 comprising at least one prepreg, such as prepreg 310 and prepreg 320 is shown. Tubular molded article 300 is hollow and includes central void 330. Suitable molded articles using the compositions disclosed herein will be readily designed by the person of ordinary skill in the art, given the benefit of this disclosure.

In accordance with certain examples, a printed circuit board comprising one or more of the compositions disclosed herein is provided. Examples of printed circuit boards include a dielectric substrate having an electrically conductive layer, e.g., a wiring layer, on one or more surfaces. In some examples, the electrically conductive layer is formed to have a predetermined pattern. In examples using multiple electrically conductive layers, the layers may be connected electrically with each other. The exact nature of the dielectric substrate can vary, and exemplary materials for dielectric substrates include but are not limited to glass, woven and nonwoven fabrics, and other suitable materials that can receive one or more of the compositions disclosed herein.

Figure 4:
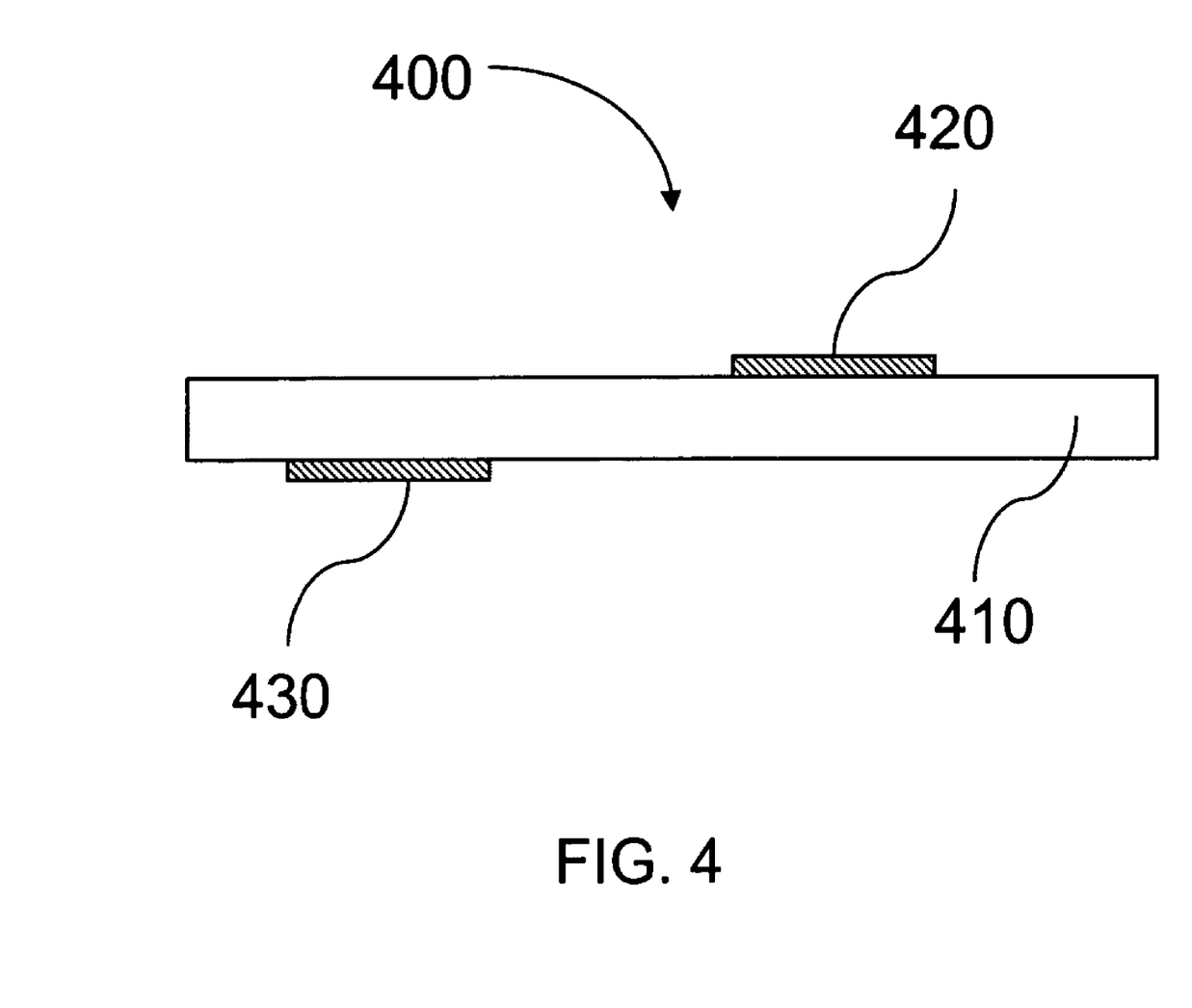
FIG. 4 is an example of a printed circuit board, in accordance with certain examples.

In accordance with certain examples, one or more of the compositions disclosed herein can be disposed on the dielectric substrate, and the resulting assembly can be cured to provide a printed circuit board. In some examples, the dielectric substrate comprises a single layer of material, whereas in other examples the dielectric substrate is a multi-layered structure formed, for example, from a plurality of stacked prepregs. Non-metal or metal foils can also be disposed on one or both surfaces of the dielectric substrate. In certain examples, metal foil can be disposed on one or more surfaces and etched away to provide a predetermined wiring pattern on the dielectric substrate. Referring now to FIG. 4, printed circuit board 400 includes dielectric substrate 410 and electrically conductive layers 420 and 430 that have been produced by etching away of a metal foil disposed on the surface of dielectric substrate 410. In some examples, the etched metal foil on one side of the dielectric substrate is in electrical communication with etched metal foil on an opposite side of the dielectric substrate through a channel, conduit, via or hole in the dielectric substrate. In other examples, the electrically conductive layers are not in electrical communication with each other. Suitable methods for preparing printed circuit boards including the compositions disclosed herein will be readily selected by the person of ordinary skill in the art, given the benefit of this disclosure.

In accordance with certain examples, a method of facilitating assembly of a prepreg is disclosed. The method includes providing one or more of the compositions disclosed herein. In certain examples, the method includes providing instructions for disposal of the composition on a substrate to form a prepreg. It will be within the ability of the person of ordinary skill in the art, given the benefit of this disclosure, to provide suitable halogen-free or substantially halogen-free flame retardant compositions for facilitating assembly of prepregs.

Certain specific examples of compositions and their use in prepregs and laminates are discussed in more detail below. All parts and percentages are by weight unless otherwise indicated.

SPECIFIC EXAMPLE 1

The following reagents were used in preparing a composition:

| Reagent | Chemical/Family | Vendor |
| --- | --- | --- |
| Epon-828 | Diglycidyl ether of bisphenol-A | Resolution |
| Noryl ® PPO ® | Polyphenylene ether | General Electric |
| BPA | Bisphenol-A | General Electric |
| BPO | Benzoyl peroxide | Ferro Corp. |
| Arafil-72 | Organic phosphate | Huntsman |
| OP-930 | Organic phosphate | Clariants |
| ThermChek 705 | Zinc octoate | Ferro Corp. |

The composition was prepared using the following procedure. 67 grams of Epon-828 was dissolved in 176 grams of toluene (industrial grade). The resulting solution was heated to 90° C. 3.36 grams of BPA was added to the heated solution. 84 g of Noryl® PPO® (intrinsic viscosity of 0.40) was added to the solution. After the solution became clear and slightly brownish, 4.48 g of benzoyl peroxide was added to the solution. The solution was stirred by a power stirrer at a speed about 150-300 rpm at 90° C. for 90 minutes to complete the equilibration of the polyphenylene ether. 21 g of Arafil-72 and 31.5 g of OP-930 were then added to the solution. The mixture was stirred with a high shearing blade (obtained commercially from Fisher Scientific) at 90° C. for 2 hours. The solution was cooled to about 50° C., and 10.6 g of Therm-Chek-705 was added. 1.05 g of Ethacure®-100 was then added to the solution followed by addition of 0.32 g of 2-ethyl-4-methylimidazole (2-MI).

The resulting mixture was applied to glass cloth style 7628 and 2116 (obtained commercially from BGF Industrials, Inc.) and treated in a Despatch LFD2-II-3 oven with air ventilation and circulation at 160° C. for 3 minutes to form a prepreg. The prepreg was pressed to a 4-ply laminate at 390° C. under 100 psi pressure using a Wabash hydraulic press for 4 to 5 hours with ½ ounce copper foil clad (obtained from Gould Electronics, Inc.) on both sides. Glass transition temperature was measured using dynamical mechanical analysis (DMA) as described in IPC-TM-650 2.4.24.4 (dated November 1998), the entire disclosure of which is hereby incorporated herein by reference for all purposes. Peel strength was tested according to IPC-TM-650 2.4.8C and 2.4.8.2. Dielectric constant and dissipation factors were measured using the two fluid cell method as detailed in IPC-TM-650 2.5.5.3C. The properties of the laminate are shown in the table below. Two glass style prepregs were tested. An 8-ply 7628 glass style prepreg was used for the burn test, and a 4-ply 2116 glass style prepreg was used for all other tests.

| Test | Results |
| --- | --- |
| Glass transition temperature (Tg) | 173° C. |
| Peel strength (lb/in) | 4.6-5.3 |
| Time to delaminate at 288° C. | >30 min. |
| Failure temperature | >320° C. |
| Dielectric constant at 1 MHz, 50% resin content | 4.0 |
| Dielectric dissipation factor at 1 MHz, 50% resin content | <0.008 |
| Total burning time for 5 samples (7628 × 8) | 31 seconds (V-0) |

The composition of Specific Example 1 exhibited high performance properties including, high peel strength, flame retardancy, low dielectric constant, low dielectric dissipation factors, etc.

SPECIFIC EXAMPLE 2-4

Compositions were prepared as described above in Example 1. The ratio of Noryl® PPO®, Thermcheck-705, Ethacure® and 2-methyl-imadazole were the same as in Example 1 above and the amount and type of phosphorated chemical(s) was varied. The mixing procedures were also the same as those described in Example 1. The values in the table below are parts by weight.

| Formulation | Specific Example 2 | Specific Example 3 | Specific Example 4 |
| --- | --- | --- | --- |
| PPO ®, epoxy, Thermchek-705, Ethacure ®-100, 2-MI | 70 | 75 | 75 |
| Arafil-72 | 30 | | |
| OP-930 | | 15 | 15 |
| APP-422 | | 10 | |
| APP-423 | | | 10 |

The resulting mixture for each of Specific Examples 2-4 was separately applied to glass cloth style 7628 and 2116 (obtained commercially from BGF Industrials, Inc.) and treated in a Despatch LFD2-II-3 oven with air ventilation and circulation at 160° C. for 3 minutes to form a prepreg. Each prepreg was pressed to a 4-ply laminate at 390° C. under 100 psi pressure using a Wabash hydraulic for 4 to 5 hours with ½ ounce copper foil clad (obtained from Gould Electronics, Inc) on both sides. Peel strength was tested according to IPC-TM-650 2.4.8C and 2.4.8.2. Dielectric constant and dissipation factors were measured using the two fluid cell method as detailed in IPC-TM-650 2.5.5.3C. The tested properties for laminates including the compositions of Specific Examples 2-4 are shown in the table below. Two glass style prepregs were tested. An 8-ply 7628 glass style prepreg was used for the burn test, and a 4-ply 2116 glass style prepreg was used for all other tests.

| Laminate Properties | Specific Example 2 | Specific Example 3 | Specific Example 4 |
| --- | --- | --- | --- |
| Tg by DMA (° C.) | 183 | 178 | 177 |
| Peel strength (lb/in) | >6.0 | >5.0 | >5.0 |
| Time to delaminate at 288° C. (min.) | >30 | >30 | >30 |
| Failure temperature (° C.) | >300 | >300 | >300 |
| Dielectric constant at 1 MHz, 50% resin content | 4.4 | 3.9 | 3.9 |
| Dielectric dissipation factor at 1 MHz, 50% resin content | <0.01 | <0.01 | <0.01 |
| Total burning time for 5 samples (7628 × 8) (sec.) | 66 | 44 | 42 |

The compositions of Specific Examples 2-4 exhibited high performance properties including, high peel strength, flame retardancy, low dielectric constants, low dielectric dissipation factors, etc.

When introducing elements of the examples disclosed herein, the articles "a", "an", "the" and "said" are intended to mean that there are one or more of the elements. The terms "comprising," "including" and "having" are intended to be open ended and mean that there may be additional elements other than the listed elements. It will be recognized by the person of ordinary skill in the art, given the benefit of this disclosure, that various components of the examples can be interchanged or substituted with various components in other examples. Should the meaning of the terms of any of the patents or publications incorporated herein by reference conflict with the meaning of the terms used in this disclosure, the meaning of the terms in this disclosure are intended to be controlling.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A halogen-free or substantially halogen-free composition comprising a flame retardant amount of chemically combined phosphorous and having a glass transition temperature of at least about 140° C.

2. The halogen-free or substantially halogen-free composition of claim 1 further comprising a polyphenylene ether.

3. The halogen-free or substantially halogen-free composition of claim 2 further comprising a halogen-free or substantially halogen-free polyepoxide.

4. The halogen-free or substantially halogen-free composition of claim 3 further comprising a compatibilizing agent and a catalyst.

5. The halogen-free or substantially halogen-free composition of claim 3 in which the flame retardant amount of chemically combined phosphorous is about 3% to about 10% phosphorous by weight based on the weight of the halogen-free or substantially halogen-free composition.

6. A halogen-free or substantially halogen-free composition comprising a flame retardant amount of chemically combined phosphorous providing a peel strength of at least about 4 lb/inch width as tested by IPC-TM-650 2.4.8C.

7. The halogen-free or substantially halogen-free composition of claim 6 further comprising a polyphenylene ether.

8. The halogen-free or substantially halogen-free composition of claim 7 further comprising a halogen-free or substantially halogen-free polyepoxide.

9. The halogen-free or substantially halogen-free composition of claim 8 further comprising a compatibilizing agent and a catalyst.

10. The halogen-free or substantially halogen-free composition of claim 8 in which the flame retardant amount of chemically combined phosphorous is about 3% to about 10% phosphorous by weight based on the weight of the halogen-free or substantially halogen-free composition.

11. A halogen-free or substantially halogen-free composition comprising a flame retardant amount of chemically combined phosphorous and having a dielectric constant at 1 MHz (50% resin content) of about 5.0 or less as tested by IPC-TM-650 2.5.5.3C.

12. The halogen-free or substantially halogen-free composition of claim 11 further comprising a polyphenylene ether.

13. The halogen-free or substantially halogen-free composition of claim 12 further comprising a halogen-free or substantially halogen-free polyepoxide.

14. The halogen-free or substantially halogen-free composition of claim 13 further comprising a compatibilizing agent and a catalyst.

15. The halogen-free or substantially halogen-free composition of claim 13 in which the flame retardant amount of chemically combined phosphorous is about 3% to about 10% phosphorous by weight based on the weight of the halogen-free or substantially halogen-free composition.

16. A halogen-free or substantially halogen-free composition comprising a flame retardant amount of chemically combined phosphorous and having a dielectric dissipation factor at 1 MHz (50% resin content) of about 0.02 or less as tested by IPC-TM-650 2.5.5.3C.

17. The halogen-free or substantially halogen-free composition of claim 16 further comprising a polyphenylene ether.

18. The halogen-free or substantially halogen-free composition of claim 17 further comprising a halogen-free or substantially halogen-free polyepoxide.

19. The halogen-free or-substantially halogen-free composition of claim 18 further comprising a compatibilizing agent and a catalyst.

20. The halogen-free or substantially halogen-free composition of claim 18 in which the flame retardant amount of chemically combined phosphorous is about 3% to about 10% phosphorous by weight based on the weight of the halogen-free or substantially halogen-free composition.

21. A halogen-free or substantially halogen-free composition comprising a flame retardant amount of chemically combined phosphorous and having a flame retardancy of V-0 as defined by the UL-94 burn test.

22. The halogen-free or substantially halogen-free composition of claim 21 further comprising a polyphenylene ether.

23. The halogen-free or substantially halogen-free composition of claim 22 further comprising a halogen-free or substantially halogen-free polyepoxide.

24. The halogen-free or-substantially halogen-free composition of claim 23 further comprising a compatibilizing agent and a catalyst.

25. The halogen-free or substantially halogen-free composition of claim 23 in which the flame retardant amount of chemically combined phosphorous is about 3% to about 10% phosphorous by weight based on the weight of the halogen-free or substantially halogen-free composition.

\* \* \* \* \*